United States Patent
Liu et al.

(10) Patent No.: US 9,646,554 B2
(45) Date of Patent: May 9, 2017

(54) LEVEL SHIFT CIRCUIT, GATE DRIVING CIRCUIT AND DISPLAY APPARATUS

(71) Applicants: BOE TECHNOLOGY GROUP CO., LTD., Beijing (CN); BEIJING BOE DISPLAY TECHNOLOGY CO., LTD., Beijing (CN)

(72) Inventors: Baoyu Liu, Beijing (CN); Liang Zhang, Beijing (CN); Yizhen Xu, Beijing (CN); Zhihua Sun, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 21 days.

(21) Appl. No.: 14/430,016

(22) PCT Filed: May 16, 2014

(86) PCT No.: PCT/CN2014/077707
§ 371 (c)(1),
(2) Date: Mar. 20, 2015

(87) PCT Pub. No.: WO2015/055005
PCT Pub. Date: Apr. 23, 2015

(65) Prior Publication Data
US 2016/0035300 A1 Feb. 4, 2016

(30) Foreign Application Priority Data
Oct. 15, 2013 (CN) .......................... 2013 1 0482290

(51) Int. Cl.
*G09G 3/36* (2006.01)
*H03K 19/0185* (2006.01)
(Continued)

(52) U.S. Cl.
CPC ............. *G09G 3/3648* (2013.01); *G09G 3/20* (2013.01); *G09G 3/3696* (2013.01);
(Continued)

(58) Field of Classification Search
CPC ...... G09G 3/20; G09G 3/3648; G09G 3/3696; G09G 2310/0267; G09G 2310/0289;
(Continued)

(56) References Cited

U.S. PATENT DOCUMENTS

2007/0146042 A1* 6/2007 Tsuchi ............... H03K 3/35613
327/333
2008/0303592 A1* 12/2008 Deguchi ............. H03F 3/45183
330/254
(Continued)

FOREIGN PATENT DOCUMENTS

CN 101383131 A 3/2009
CN 101567669 A 10/2009
(Continued)

OTHER PUBLICATIONS

Second Chinese Office Action dated Feb. 23, 2016; Appln. No. 201310482290.3.
(Continued)

*Primary Examiner* — Amare Mengistu
*Assistant Examiner* — Gloryvid Figueroa-Gibson
(74) *Attorney, Agent, or Firm* — Ladas & Parry LLP

(57) ABSTRACT

Provided are a level shift circuit, a gate driving circuit and a display apparatus. The level shift circuit includes: a third to a sixth transistor, sources and gates thereof being connected to a DC power source and an offset voltage terminal respectively; a seventh transistor, source and gate thereof being connected to a reference ground and the offset voltage terminal respectively; and a first to a second transistor, gates and sources thereof being connected to an input signal
(Continued)

terminal and drain of seventh transistor respectively, wherein drains of third and fifth transistors are connected as a first output terminal which is connected to drain of the first transistor, drains of fourth and sixth transistors are connected as a second output terminal which is connected to drain of the second transistor. Common-mode voltage of two output terminals of the level shift circuit with respect to the reference ground is not reduced.

19 Claims, 1 Drawing Sheet

(51) Int. Cl.
    *G09G 3/20*            (2006.01)
    *H03K 19/0175*     (2006.01)

(52) U.S. Cl.
    CPC ............... *H03K 19/017509* (2013.01); *H03K 19/018528* (2013.01); *G09G 2300/0426* (2013.01); *G09G 2310/0267* (2013.01); *G09G 2310/0289* (2013.01)

(58) Field of Classification Search
    CPC ... G09G 2300/0426; H03K 19/017509; H03K 19/018528
    USPC ............................ 345/98–100, 205, 211–214
    See application file for complete search history.

(56) References Cited

U.S. PATENT DOCUMENTS

| | | |
|---|---|---|
| 2009/0058773 A1 | 3/2009 | Chang |
| 2009/0085788 A1* | 4/2009 | Yamazaki ........... H03F 3/45183 341/153 |
| 2010/0271103 A1 | 10/2010 | Miyamoto et al. |
| 2013/0136224 A1 | 5/2013 | Qing et al. |
| 2013/0162294 A1 | 6/2013 | Henmi et al. |
| 2013/0214865 A1 | 8/2013 | Bulzacchelli et al. |

FOREIGN PATENT DOCUMENTS

| | | |
|---|---|---|
| CN | 101662264 A | 3/2010 |
| CN | 102654968 A | 9/2012 |
| CN | 102800292 A | 11/2012 |
| CN | 103338015 A | 10/2013 |
| CN | 103532539 A | 1/2014 |

OTHER PUBLICATIONS

International Search Report Appln. No. PCT/CN2014/077707; Dated Aug. 27, 2014.
Written Opinion of the International Searching Authority Appln. No. PCT/CN2014/077707; Dated Aug. 27, 2014.
First Chinese Office Action Appln. No. 201310482290.3; Dated Sep. 1, 2015.

* cited by examiner

US 9,646,554 B2

LEVEL SHIFT CIRCUIT, GATE DRIVING CIRCUIT AND DISPLAY APPARATUS

TECHNICAL FIELD OF THE DISCLOSURE

The present disclosure relates to a level shift circuit, a gate driving circuit and a display apparatus.

BACKGROUND

In many integrated circuits, in order to meet the voltage withstanding requirement of different semiconductor devices in the integrated circuit, it is needed to convert a lower level signal into a higher level signal, or convert a higher level signal into a lower level signal. The level shift circuit is used to realize such a function.

In the liquid crystal display technology, the function of the gate driving circuit is to generate scan signals required by the liquid crystal display panel to turn on each scan row in turn in sequence. The gate driving circuit is mainly composed of circuits such as shift registers, a level shift circuit, buffers, and so on. The level shift circuit is particularly important, and it directly provides the voltage required to turn on each gate in the liquid crystal display panel.

In the gate driving circuit, the level shift circuit is a typical amplification circuit, which usually adopts a differential amplification circuit to improve the anti-interference ability to the environmental noise.

SUMMARY

At least one embodiment of the present disclosure provides a level shift circuit, a gate driving circuit and a display apparatus. The level shift circuit is used to solve the known problem that the common-mode voltage of the first output terminal and the second output terminal of the differential amplification circuit with respect to a reference ground will be reduced when the reduction of the aspect ratio of the load transistor is used to improve the amplification gain.

At least one embodiment of the present disclosure provides a level shift circuit comprising a first transistor, a second transistor, a third transistor, a fourth transistor, a fifth transistor, a sixth transistor and a seventh transistor.

The sources of the third transistor, the fourth transistor, the fifth transistor and the sixth transistor are connected to a DC power source respectively, and their gates are connected to an offset voltage terminal respectively; the drains of the third transistor and the fifth transistor are connected as a first output terminal; the drains of the fourth transistor and the sixth transistor are connected as a second output terminal.

The drain of the first transistor is connected to the first output terminal, the drain of the second transistor is connected to the second output terminal; the gates of the first transistor and the second transistor are both connected to an input signal terminal, their sources are both connected to the drain of the seventh transistor, and the input signal terminal provides a signal to be level-converted; the source of the seventh transistor is connected to a reference ground, and the gate of the seventh transistor is connected to the offset voltage terminal.

Optionally, the third transistor, the fourth transistor, the fifth transistor and the sixth transistor are P type transistors, and the first transistor, the second transistor and the seventh transistor are N type transistors.

Optionally, the aspect ratio of the first transistor is the same as that of the second transistor.

Optionally, the signal to be level-converted provided by the input signal terminal is an analog signal.

The beneficial effects of at least one embodiment of the present disclosure are as follows. For an aspect ratio of the load transistor in the given level shift circuit, the transconductance of the load transistor is reduced by reducing the current flowing through the load transistor, thus improving the gain of the level shift circuit. Since the aspect ratio of the load transistor is not reduced, the common-mode voltage of the two output terminals of the level shift circuit with respect to the reference ground will not be reduced.

At least one embodiment of the present disclosure provides a gate driving circuit comprising an offset circuit which comprises an offset voltage terminal. The gate driving circuit further comprises a level shift circuit as described above, the gates of the third transistor, the fourth transistor, the fifth transistor and the sixth transistor of the level shift circuit are connected to the offset voltage terminal provided by the offset circuit; the gate of the seventh transistor of the level shift circuit is connected to the offset voltage terminal.

The beneficial effects of at least one embodiment of the present disclosure are as follows. The level shift circuit comprised in the gate driving circuit, for an aspect ratio of the load transistor in the given level shift circuit, reduces the transconductance of the load transistor by reducing the current flowing through the load transistor, thus improving the gain of the level shift circuit. Since the aspect ratio of the load transistor is not reduced, the common-mode voltage of the two output terminals of the level shift circuit with respect to the reference ground will not be reduced, ensuring the driving capability of the gate driving circuit.

At least one embodiment of the present disclosure provides a display apparatus comprising an array substrate on which pixel arrays and gate signal lines for driving the pixel arrays are arranged, wherein the display apparatus further comprises a gate driving circuit as described above, and the first output terminal and the second output terminal of the level shift circuit comprised in the gate driving circuit are connected to the gate signal lines simultaneously.

The beneficial effects of at least one embodiment of the present disclosure are as follows. The level shift circuit comprised in the gate driving circuit, for an aspect ratio of the load transistor in the given level shift circuit, reduces the transconductance of the load transistor by reducing the current flowing through the load transistor, thus improving the gain of the level shift circuit. Since the aspect ratio of the load transistor is not reduced, the common-mode voltage of the two output terminals of the level shift circuit with respect to the reference ground will not be reduced, ensuring the capability of driving pixel arrays of the gate driving circuit, and thus ensuring the display effects.

DETAILED DESCRIPTION

Figure 1:
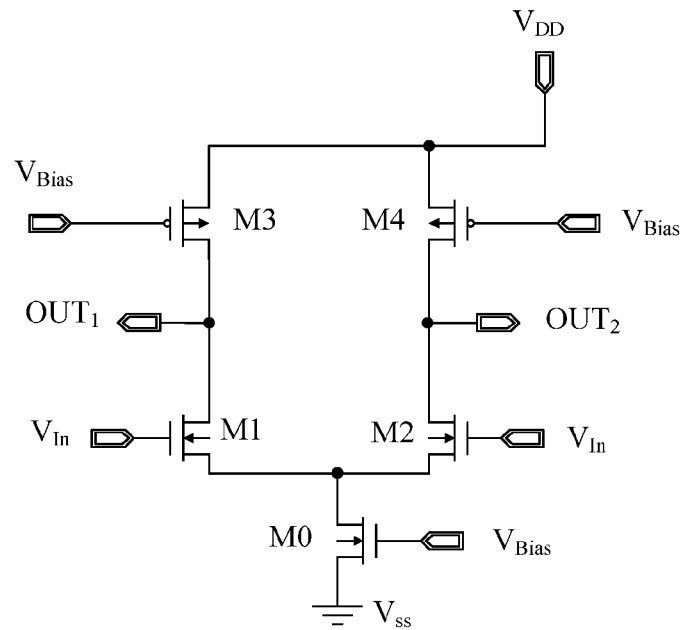
FIG. 1 is a level shift circuit in a known solution.

In the following, the implementation procedure of embodiments of the present disclosure will be described in detail in connection with accompanying drawings of the present disclosure. It is noted that, the same or similar reference symbols in the drawings represent the same or similar elements. The embodiments described with reference to the drawings in the following are exemplary, and only for explaining the present disclosure, but cannot be considered as limiting of the present disclosure.

FIG. 1 is a level shift circuit in a known solution. The level shift circuit as shown in FIG. 1 comprises P type transistors M3 and M4 and N type transistors M0, M1 and M2. The sources of the P type transistors M3 and M4 are connected to a power source $V_{DD}$ respectively, and the gates of the P type transistors M3 and M4 are connected to the output $V_{Bias}$ of an offset circuit respectively. The drain of the P type transistor M3 is taken as a first output terminal $OUT_1$. The drain of the P type transistor M4 is taken as a second output terminal $OUT_2$. The drain of the N type transistor M1 is connected to the first output terminal $OUT_1$, and the drain of the N type transistor M2 is connected to the second output terminal $OUT_2$. The gates of the N type transistors M1 and M2 are connected to an input signal $V_{In}$. The sources of the N type transistors M1 and M2 are connected to the drain of the N type transistor M0. The source of the N type transistor M0 is connected to a reference ground $V_{SS}$, and the gate of the N type transistor M0 is connected to the output $V_{Bias}$ of the offset circuit. For a differential amplification circuit, because the gain of the differential amplification circuit is inversely proportional to the transconductance of a load transistor, and the transconductance is also proportional to the load transistor, in order to obtain larger gain, the aspect ratio of the load transistor of the differential amplification circuit is usually reduced to reduce the transconductance of the load transistor and to realize the object of improving the gain of the differential amplification circuit. However, the reduction of the aspect ratio of the load transistor will reduce the common-mode voltage of the first output terminal and the second output terminal of the differential amplification circuit with respect to the reference ground $V_{SS}$.

Figure 2:
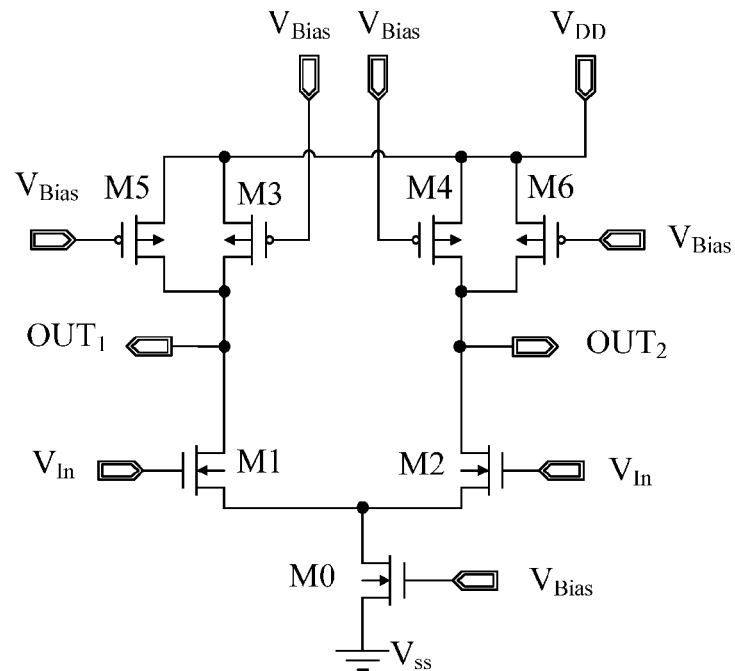
FIG. 2 is a level shift circuit provided by an embodiment of the present disclosure.

FIG. 2 is a level shift circuit provided by an embodiment of the present disclosure. As shown in FIG. 2, the level shift circuit comprises a first transistor M1, a second transistor M2, a third transistor M3, a fourth transistor M4, a fifth transistor M5, a sixth transistor M6 and a seventh transistor M0.

The sources of the third transistor M3, the fourth transistor M4, the fifth transistor M5 and the sixth transistor M6 are connected to a DC power source $V_{DD}$ respectively, and their gates are connected to an offset voltage terminal $V_{Bias}$ respectively; the drains of the third transistor M3 and the fifth transistor M5 are connected as a first output terminal $OUT_1$; the drains of the fourth transistor M4 and the sixth transistor M6 are connected as a second output terminal $OUT_2$.

The drain of the first transistor M1 is connected to the first output terminal $OUT_1$, the drain of the second transistor M2 is connected to the second output terminal $OUT_2$; the gates of the first transistor M1 and the second transistor M2 are both connected to an input signal terminal $V_{In}$, their sources are both connected to the drain of the seventh transistor M0, and the input signal terminal $V_{In}$ provides a signal to be level-converted; the source of the seventh transistor M0 is connected to a reference ground $V_{SS}$, and the gate of the seventh transistor M0 is connected to the offset voltage terminal $V_{Bias}$.

Optionally, the third transistor M3, the fourth transistor M4, the fifth transistor M5 and the sixth transistor M6 are P type transistors, and the first transistor M1, the second transistor M2 and the seventh transistor M0 are N type transistors.

In the embodiment of the present disclosure, the current flowing through the third transistor M3 and the fourth transistor M4 as the load transistors is reduced by adding the fifth transistor M5 and the sixth transistor M6 at the load side, reducing the transconductance of the level shift circuit as shown in FIG. 2.

The detailed principle and the deduction procedure are as follows.

The level shift circuit of the known solution shown in FIG. 1 is a typical differential amplification circuit whose gain calculation equation is as equation (1):

$$A_V = -g_{mN}(g_{mP}^{-1}\|r_{ON}\|r_{OP}) \approx -\frac{g_{mN}}{g_{mP}} \quad \text{equation (1)}$$

wherein $g_{mN}$ is the transconductance of the N type transistor differential pair, $g_{mP}$ is the transconductance of the P type transistor differential pair, $r_{ON}$ is the internal resistance of the N type transistors, and $r_{OP}$ is the internal resistance of the P type transistors.

When the N type transistors and the P type transistors operate simultaneously, the gain $A_V$ of the differential amplification circuit depends on the ratio between the transconductance of the N type transistors and the transconductance of the P type transistors. When the gain $A_V$ needs to be adjusted, usually the adjustment of the transconductance $g_{mP}$ of the load transistors is employed, that is, adjusting the transconductance $g_{mP}$ of the P type transistors M3 and M4 as shown in FIG. 1.

Therefore, in order to increase the gain $A_V$, usually, the transconductance $g_{mP}$ of the P type transistors M3 and M4 is reduced, and the transconductance $g_m$ is as shown in equation (2):

$$g_m = \frac{\partial I_D}{\partial V_{GS}}(V_{DS,const}) = \mu_n C_{ox} \frac{W}{L}(V_{GS} - V_{TH}) \quad \text{equation (2)}$$

wherein $V_{DS}$ is the source-drain voltage of a transistor, $V_{GS}$ is the gate-source voltage of the transistor, $V_{TH}$ is the threshold voltage of the transistor, $C_{ox}$ is the capacitance of the oxide layer, $\mu_n$ is the mobility of the transistor, W is the channel width of the transistor, L is the channel length of the transistor, and $I_D$ is the offset current.

The offset current $I_D$ is as shown in equation (3):

$$I_D = \frac{1}{2}\mu_n C_{ox} \frac{W}{L}(V_{GS} - V_{TH})^2. \quad \text{equation (3)}$$

For the differential amplification circuit as shown in FIG. 1, according to equation (2), in order to reduce the transconductance $g_{mP}$ of the P type transistors M3 and M4, it is usually realized by reducing the aspect ratio W/L of the P type transistors M3 and M4. However, for a given offset current $I_D$, when the aspect ratio W/L of the P type transistors M3 and M4 is reduced, $V_{GS}$–$V_{TH}$ would be increased. Therefore, for the entire differential amplification circuit, since the power source $V_{DD}$ of the circuit keeps constant, $V_{GS}$–$V_{TH}$ of the P type transistors M3 and M4 as the load transistors increases, which means that the common-mode voltage of the output signal with respect to the ground will decrease, such that the driving capability of the level shift circuit as shown in FIG. 1 is limited.

In order to solve the above problem, another equation (4) representing the transconductance $g_m$ is deduced based on equation (2) and equation (3) as follows:

$$g_m = \sqrt{2\mu_n C_{ox} \frac{W}{L} I_D} .\qquad\text{equation (4)}$$

As can be seen from equation (4), it is possible to change the offset current $I_D$ to reduce the transconductance $g_m$ without changing the size of given load transistors.

Comparing with the level shift circuit as shown in FIG. 1, based on the above principle, in the level shift circuit as shown in FIG. 2 provided by an embodiment of the present disclosure, the fifth transistor M5 connected with the third transistor M3 in parallel and the sixth transistor M6 connected with the fourth transistor M4 in parallel are added at the load side, and thus the offset current flowing through respective P type transistors as the load is reduced without changing the aspect ratio W/L of the given load transistors, reducing the transconductance of the P type transistor differential pair.

Optionally, the aspect ratio of the first transistor M1 is the same as that of the second transistor M2.

Optionally, the signal to be level-converted provided by the input signal terminal $V_{In}$ is an analog signal.

The beneficial effects of at least one embodiment of the present disclosure are as follows. For an aspect ratio of the load transistor in the given level shift circuit, the transconductance of the load transistor is reduced by reducing the current flowing through the load transistor, thus improving the gain of the level shift circuit. Since the aspect ratio of the load transistor is not reduced, the common-mode voltage of the two output terminals of the level shift circuit with respect to the reference ground will not be reduced.

At least one embodiment of the present disclosure provides a gate driving circuit comprising an offset circuit which comprises an offset voltage terminal $V_{Bias}$. The gate driving circuit further comprises a level shift circuit as described in the above embodiments, the gates of the third transistor M3, the fourth transistor M4, the fifth transistor M5 and the sixth transistor M6 of the level shift circuit are connected to the offset voltage terminal $V_{Bias}$ provided by the offset circuit; the gate of the seventh transistor M0 of the level shift circuit is connected to the offset voltage terminal $V_{Bias}$.

The beneficial effects of at least one embodiment of the present disclosure are as follows. The level shift circuit comprised in the gate driving circuit, for an aspect ratio of the load transistor in the given level shift circuit, reduces the transconductance of the load transistor by reducing the current flowing through the load transistor, thus improving the gain of the level shift circuit. Since the aspect ratio of the load transistor is not reduced, the common-mode voltage of the two output terminals of the level shift circuit with respect to the reference ground will not be reduced, ensuring the driving capability of the gate driving circuit.

At least one embodiment of the present disclosure provides a display apparatus comprising an array substrate on which pixel arrays and gate signal lines for driving the pixel arrays are arranged, wherein the display apparatus further comprises a gate driving circuit as described in the above embodiment, and the first output terminal $OUT_1$ and the second output terminal $OUT_2$ of the level shift circuit comprised in the gate driving circuit are connected to the gate signal lines simultaneously.

The beneficial effects of at least one embodiment of the present disclosure are as follows. The level shift circuit comprised in the gate driving circuit, for an aspect ratio of the load transistor in the given level shift circuit, reduces the transconductance of the load transistor by reducing the current flowing through the load transistor, thus improving the gain of the level shift circuit. Since the aspect ratio of the load transistor is not reduced, the common-mode voltage of the two output terminals of the level shift circuit with respect to the reference ground will not be reduced, ensuring the capability of driving pixel arrays of the gate driving circuit, and thus ensuring the display effects.

Obviously, those skilled in the art can make various modifications and variations to the present disclosure without departing from the spirit and the scope of the present disclosure. As such, if those modifications and variations fall within the scope of the claims and their equivalent of the present disclosure, the present disclosure is intended to incorporate those modifications and variations.

The present application claims the priority of Chinese Patent Application No. 201310482290.3 filed on Oct. 15, 2013, entire content of which is incorporated as part of the present invention by reference.

What is claimed is:

1. A level shift circuit comprising a first transistor (M1), a second transistor (M2), a third transistor (M3), a fourth transistor (M4), a fifth transistor (M5), a sixth transistor (M6) and a seventh transistor (M0);

wherein the sources of the third transistor (M3), the fourth transistor (M4), the fifth transistor (M5) and the sixth transistor (M6) are connected to a DC power source ($V_{DD}$) respectively, and their gates are connected to an offset voltage terminal ($V_{Bias}$) respectively; the drains of the third transistor (M3) and the fifth transistor (M5) are connected as a first output terminal ($OUT_1$); the drains of the fourth transistor (M4) and the sixth transistor (M6) are connected as a second output terminal ($OUT_2$);

wherein the drain of the first transistor (M1) is connected to the first output terminal ($OUT_1$), the drain of the second transistor (M2) is connected to the second output terminal ($OUT_2$); the gates of the first transistor (M1) and the second transistor (M2) are both directly connected to an input signal terminal ($V_{In}$), their sources are both connected to the drain of the seventh transistor (M0), and the input signal terminal ($V_{In}$) provides a signal to be level-converted; the source of the seventh transistor (M0) is connected to a reference ground ($V_{SS}$), and the gate of the seventh transistor (M0) is connected to the offset voltage terminal ($V_{Bias}$); and wherein the gates of the third transistor (M3), the fourth transistor (M4), the fifth transistor (M5), the sixth transistor (M6) and the seventh transistor (M0) are all directly connected to the offset voltage terminal ($V_{Bias}$).

2. The level shift circuit according to claim 1, wherein the third transistor (M3), the fourth transistor (M4), the fifth transistor (M5) and the sixth transistor (M6) are P type transistors, and the first transistor (M1), the second transistor (M2) and the seventh transistor (M0) are N type transistors.

3. The level shift circuit according to claim 2, wherein an aspect ratio of the first transistor (M1) is the same as that of the second transistor (M2).

4. The level shift circuit according to claim 3, wherein the signal to be level-converted provided by the input signal terminal ($V_{In}$) is an analog signal.

5. The level shift circuit according to claim 2, wherein the signal to be level-converted provided by the input signal terminal ($V_{In}$) is an analog signal.

6. The level shift circuit according to claim 1, wherein an aspect ratio of the first transistor (M1) is the same as that of the second transistor (M2).

7. The level shift circuit according to claim 6, wherein the signal to be level-converted provided by the input signal terminal ($V_{In}$) is an analog signal.

8. The level shift circuit according to claim 1, wherein the signal to be level-converted provided by the input signal terminal ($V_{In}$) is an analog signal.

9. A gate driving circuit comprising an offset circuit which comprises an offset voltage terminal ($V_{Bias}$), wherein the gate driving circuit further comprises a level shift circuit according to claim 1, the gates of the third transistor (M3), the fourth transistor (M4), the fifth transistor (M5) and the sixth transistor (M6) of the level shift circuit are connected to the offset voltage terminal ($V_{Bias}$) provided by the offset circuit; the gate of the seventh transistor (M0) of the level shift circuit is connected to the offset voltage terminal ($V_{Bias}$) provided by the offset circuit.

10. A display apparatus comprising an array substrate on which pixel arrays and gate signal lines for driving the pixel arrays are arranged, wherein the display apparatus comprises the gate driving circuit according to claim 9, and the first output terminal ($OUT_1$) and the second output terminal ($OUT_2$) of the level shift circuit comprised in the gate driving circuit are connected to the gate signal lines simultaneously.

11. The display apparatus according to claim 10, wherein the third transistor (M3), the fourth transistor (M4), the fifth transistor (M5) and the sixth transistor (M6) are P type transistors, and the first transistor (M1), the second transistor (M2) and the seventh transistor (M0) are N type transistors.

12. The display apparatus according to claim 10, wherein an aspect ratio of the first transistor (M1) is the same as that of the second transistor (M2).

13. The display apparatus according to claim 10, wherein the signal to be level-converted provided by the input signal terminal ($V_{In}$) is an analog signal.

14. The gate driving circuit according to claim 9, wherein the third transistor (M3), the fourth transistor (M4), the fifth transistor (M5) and the sixth transistor (M6) are P type transistors, and the first transistor (M1), the second transistor (M2) and the seventh transistor (M0) are N type transistors.

15. The gate driving circuit according to claim 14, wherein an aspect ratio of the first transistor (M1) is the same as that of the second transistor (M2).

16. The gate driving circuit according to claim 14, wherein the signal to be level-converted provided by the input signal terminal ($V_{In}$) is an analog signal.

17. The gate driving circuit according to claim 9, wherein an aspect ratio of the first transistor (M1) is the same as that of the second transistor (M2).

18. The gate driving circuit according to claim 17, wherein the signal to be level-converted provided by the input signal terminal ($V_{In}$) is an analog signal.

19. The gate driving circuit according to claim 9, wherein the signal to be level-converted provided by the input signal terminal ($V_{In}$) is an analog signal.

* * * * *